US008860427B2

(12) United States Patent
Cortigiani et al.

(10) Patent No.: US 8,860,427 B2
(45) Date of Patent: Oct. 14, 2014

(54) FAILURE DETECTION FOR SERIES OF ELECTRICAL LOADS

(75) Inventors: Fabrizio Cortigiani, Padua (IT); Andrea Logiudice, Padua (IT); Andreas Eder, Weissenstein (AT); Giovanni Capodivacca, Padua (IT)

(73) Assignee: Infineon Technologies AG, Neubiberg (DE)

( * ) Notice: Subject to any disclaimer, the term of this patent is extended or adjusted under 35 U.S.C. 154(b) by 440 days.

(21) Appl. No.: 13/221,562

(22) Filed: Aug. 30, 2011

(65) Prior Publication Data

US 2012/0074947 A1 Mar. 29, 2012

Related U.S. Application Data

(63) Continuation-in-part of application No. 12/426,577, filed on Apr. 20, 2009, now Pat. No. 8,044,667.

(51) Int. Cl.
*G01R 31/08* (2006.01)
*H05B 33/08* (2006.01)

(52) U.S. Cl.
CPC ........ *H05B 33/0887* (2013.01); *H05B 33/0845* (2013.01)
USPC .......... 324/522

(58) Field of Classification Search
CPC .......... H05B 33/0875; H05B 33/0884
USPC .......... 324/314, 522, 537
See application file for complete search history.

(56) References Cited

U.S. PATENT DOCUMENTS

| | | | | |
|---|---|---|---|---|
| 4,394,647 | A | 7/1983 | Van Dine | |
| 5,444,390 | A | 8/1995 | Bartlett et al. | |
| 6,225,912 | B1 | 5/2001 | Tanaka et al. | |
| 2006/0170287 | A1 * | 8/2006 | Ito et al. | 307/10.1 |
| 2007/0015750 | A1 | 1/2007 | Baeurle et al. | |
| 2007/0159750 | A1 | 7/2007 | Peker et al. | |
| 2010/0264828 | A1 | 10/2010 | Cortigiani et al. | |

FOREIGN PATENT DOCUMENTS

| | | | |
|---|---|---|---|
| DE | 199 29 165 | A1 | 1/2000 |
| JP | 2005-109025 | A | 4/2005 |
| JP | 2008-016302 | A | 1/2008 |

OTHER PUBLICATIONS

ROHM Semiconductor, Technical Note, "White LED Driver IC for Automotive Lamp (Switching Regulator Type)," LED Driver Series for Automotive Lamp, BD8381EFV-M, Ver. 0.11, Oct. 2010, pp. 1-20.

* cited by examiner

*Primary Examiner* — Melissa Koval
*Assistant Examiner* — Daniel Miller
(74) *Attorney, Agent, or Firm* — Slater & Matsil, L.L.P.

(57) ABSTRACT

A device can be used for detecting failures in an illumination device having a plurality of light emitting diodes connected in series. A first circuit node, a second circuit node, and a third circuit node interface the illumination device such that a voltage supplying the plurality of light emitting diodes is applied between the first and the second circuit node and a first fraction of the supply voltage drop is provided between the third and the second circuit node. An evaluation unit is coupled to the first circuit node, the second circuit node, and the third circuit node and configured to assess whether a voltage present at the third circuit node is within a pre-defined range of tolerance about a nominal value that is defined as a second fraction of the supply voltage present between the first and the second circuit node.

23 Claims, 3 Drawing Sheets

FAILURE DETECTION FOR SERIES OF ELECTRICAL LOADS

This is a continuation-in-part application of U.S. application Ser. No. 12/426,577, which was filed on Apr. 20, 2009, which is incorporated herein by reference.

TECHNICAL FIELD

The invention relates to the field of failure detection to detect failures, such as short circuits or open circuits, of electrical loads, especially to detect failures of light emitting diodes (LEDs) in a chain of LEDs connected in series.

BACKGROUND

Illumination devices (e.g., lamps) that comprise light emitting diodes (LEDs) as luminescent components usually cannot simply be connected to a voltage supply but have to be driven by special driver circuits (or control circuits) providing a defined load current to the LEDs in order to provide a desired radiant power (radiant flux). Since a single LED exhibits only small forward voltages (from about 1.5 V for infrared GaAs LEDs ranging up to 4 V for violet and ultraviolet InGaN LEDs) compared to commonly used supply voltages (for example, 12 V, 24 V and 42 V in automotive applications) several LEDs are connected in series to form so-called LED chains.

In many applications it is desirable to have a fault detection included in the driver circuits (or control circuits) that allows for detecting defective LEDS in the LED chains connected to the driver circuit. An LED can be regarded as a two-terminal network. A defective LED becomes manifest in either an open circuit or a short circuit between the two terminals. If one LED of a LED chain fails as an open circuit this is easy to detect since the defective LED interrupts the current for the whole LED chain. If one LED of a LED chain fails as a short circuit only the defective LED stops radiating which in some applications might not be a problem. However, other applications require the radiant power to stay within a narrow range.

Thus, there is a general need for a circuit arrangement capable of reliably detecting faults within a LED chain including short circuit defects.

SUMMARY OF THE INVENTION

A circuit for detecting failures in an illumination device, which includes a plurality of light emitting diodes connected in series, is disclosed. The circuit includes a first, a second, and a third circuit node for interfacing the illumination device such that the voltage supplying the plurality of light emitting diodes is applied between the first and the second circuit node and a first fraction of the supply voltage is provided between the third and the second circuit node. The circuit further includes an evaluation unit that is coupled to the first, the second, and the third circuit node and that is configured to assess whether the voltage present at the third circuit node is within a pre-defined range of tolerance about a nominal value. This nominal value is defined as a second fraction of the supply voltage present between the first and the second circuit node. Further, the second fraction is preset in such a manner that the nominal value substantially equals the voltage present at the third circuit node, when the illumination device includes only faultless LEDs.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In many applications it is desirable to have a fault detection included in the driver circuits (or control circuits) that allows for detecting defective LEDS in the LED chains connected to the driver circuit. A defective LED becomes manifest in either an open circuit or a short circuit between the two terminals of the defective LED. If one LED of a LED chain fails as an open circuit the defective LED interrupts the current for the whole LED chain which is easy to detect, for example, by monitoring the load current of the LED chain. If one LED of a LED chain fails as a short circuit only the defective LED stops radiating light and the overall voltage drop across the LED chain decreases by the forward voltage of the respective LED. A short circuit defect may therefore be detected by monitoring the overall voltage drop across the LED chain. If this overall voltage drop falls below a constant threshold voltage, a defective LED (which has failed as a short circuit) is detected.

A problem that is inherent of such a concept of short circuit fault detection is that the voltage drop across a LED chain does not only decrease due to a short circuit defect of one LED but may also vary due to variations of temperature as well as due to aging effects. As a result, it is possible that a fault can be detected although all LEDs are good or that a defective LED will not be detected. This may be the case especially in applications with wide temperature ranges, for example in automotive applications where incandescent lamps are increasingly substituted by illumination devices based on LEDs.

Co-pending and commonly-owned application Ser. No. 12/426,577 (published as US 2010/0264828) suggests a circuit for detection failures in a chain of light emitting diodes. However, the number of LEDs in one LED chain can be limited and the known circuit may not reliably detect failures when the number of LEDs in a chain is above a certain maximum number. The maximum number depends on the statistical variance (resulting from production tolerances) of the forward voltages of the LEDs composing the LED chain.

Figure 1:
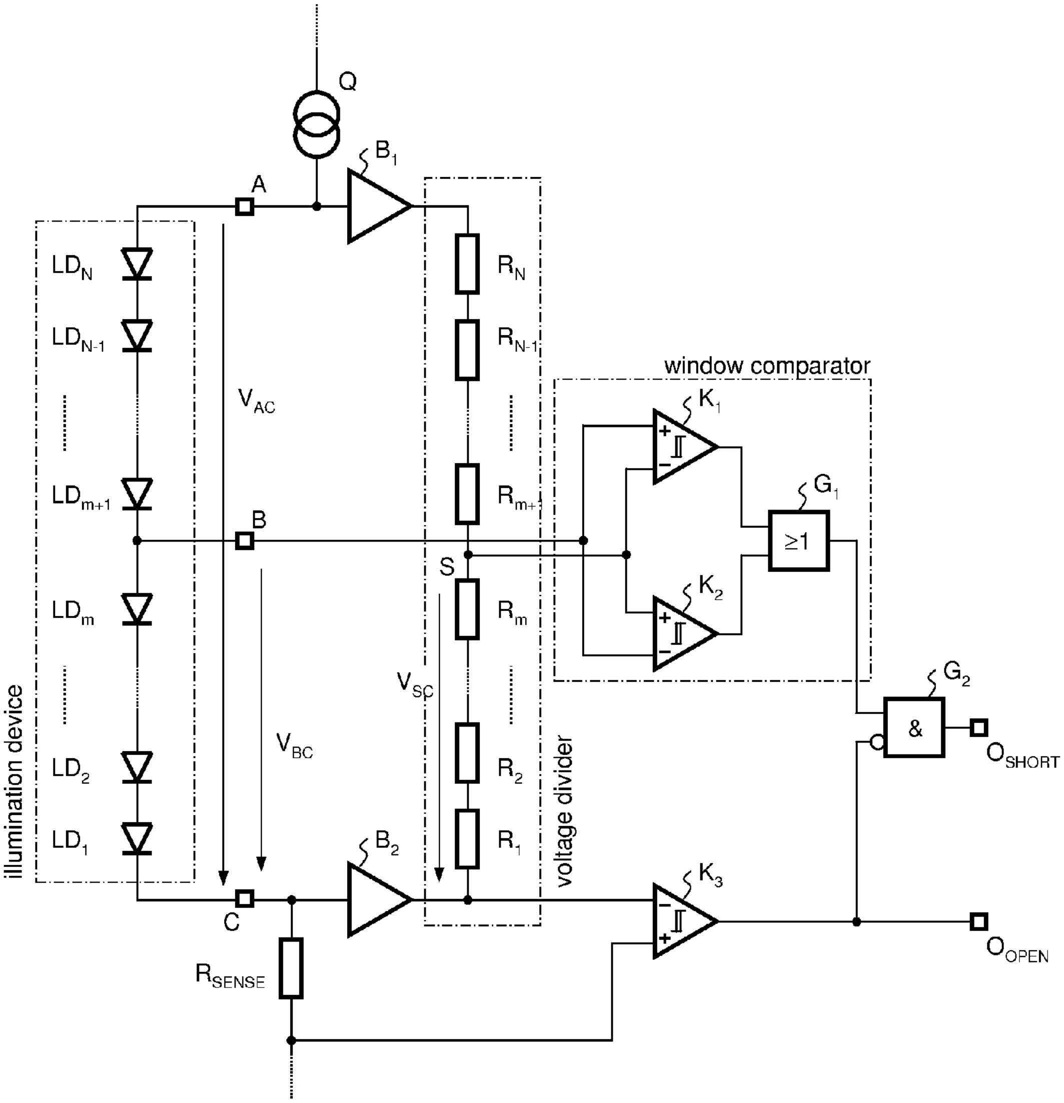
FIG. 1 illustrates a first example of the invention comprising a voltage divider for providing the nominal value.

The circuit for detecting failures in an illumination device comprising at least two light emitting diodes connected in series (illumination device comprising a LED chain) disclosed in the co-pending application will be outlined below. FIG. 1 illustrates a circuit that comprises a first circuit node A, a second circuit node C, and a third circuit node B for interfacing the illumination device such that the voltage drop $V_{AC}$ across the chain of light emitting diodes $LD_1, LD_2, \ldots, LD_N$ is applied between the circuit nodes A and C and a fraction $V_{BC}$ of the voltage drop $V_{AC}$ is applied between the circuit nodes B and C. That is, the chain of LEDs $LD_1, LD_2, \ldots, LD_N$ has a middle tap connected to circuit node B. The ratio $k_{nominal}$ between the fractional voltage $V_{BC}$ and the voltage drop $V_{AC}$ across the LED chain is (approximately, as will be discussed later)

$$k_{nominal}=m/N,$$

whereby N is the total number of LEDs in the chain and m the number of LEDs between the middle tap of the LED chain and circuit node C. The ratio $k_{nominal}$ is therefore a predefined value dependent on the physical set-up of the LED chain.

The circuit of FIG. 1 further comprises an evaluation unit coupled to the circuit nodes A, B, and C. The evaluation unit is configured to assess whether the electric potential $V_B$ present at the third circuit node B is within a pre-defined range of tolerance about a nominal value $k_{nominal}\cdot V_{AC}$. As mentioned above, the nominal value $k_{nominal}\cdot V_{AC}$ is defined as a pre-defined fraction $k_{nominal}=m/N$ of the potential difference $V_{AC}$ between the circuit nodes A and C.

By using a pre-defined ratio $k_{nominal}$ of the voltage drop $V_{AC}$ across the LED chain as criterion instead of using a fixed voltage threshold as mentioned above for assessing whether the LED chain comprises defective LEDs the fault detection becomes more reliable and more robust against variations of the forward voltages of the single LEDs, whereby these variations may be, inter alia, due to changes in temperature or due to aging effects.

As illustrated in the example of FIG. 1 the evaluation unit may comprise a voltage divider coupled to the circuit nodes A and C and configured to provide at a middle tap S the above mentioned pre-defined fraction $V_{SC}=k_{nominal}\cdot V_{AC}=V_{AC}\cdot m/N$ of the potential difference $V_{AC}$ between circuit nodes A and C. That is, the voltage divider provides a fractional voltage $V_{SC}$ that is (approximately) equal to the fractional voltage $V_{BC}$ provided by the LED chain in the case of all LEDs of the chain are fully functional.

In case of a short circuit between the anode terminal and the cathode terminal of at least one LED of the LED chain the actual ratio $k=V_{BC}/V_{AC}$ will change to either $$k=m/(N-1), \text{ thus } k>k_{nominal}$$

in case the defective LED is located between the circuit nodes A and B or $$k=(m-1)/(N-1), \text{ thus } k<k_{nominal}$$

in case the defective LED is located between the circuit nodes B and C. When evaluating both of the above mentioned cases a localization of the defective LED may be implemented. This may be especially useful if the illumination device comprises two spatially separate LED sub-chains connected in series and the circuit node B connects to the illumination device in between these sub-chains. It is thus possible to locate a defective LED in either the first or the second LED sub-chain.

By checking whether the fractional voltage $V_{BC}=k\cdot V_{AC}$ is approximately equal to the voltage $V_{SC}=k_{nominal}\cdot V_{AC}$ the integrity of the LED chain can be tested. In practice "approximately equal" means that the voltage $V_{BC}=k\cdot V_{AC}$ is within a given range of tolerance $\Delta V$ about the voltage $V_{SC}=k_{nominal}\cdot V_{AC}$, for example, $V_{BC}\in[V_{SC}-\Delta V, V_{SC}+\Delta V]$, which is tantamount to $k\in[k_{nominal}-\Delta k, k_{nominal}+\Delta k]$, if only the ratios are considered (note: $\Delta V=\Delta k\cdot V_{AC}$).

The above described comparison between the voltages $V_{BC}$ and $V_{SC}$ may be implemented by using a window comparator with a relatively "narrow" window compared to the absolute value of the fractional voltage $V_{BC}$ (or $V_{SC}$). In the example of FIG. 1 the window comparator is realized by using two comparators $K_1$ and $K_2$, each having a hysteresis $\Delta V$, and an OR-gate $G_1$ that combines the output signals of the comparators $K_1$ and $K_2$. The output of the OR gate $G_1$ indicates whether a defective LED is detected in the LED chain $L_1, L_2, \ldots, L_N$ or whether the LED chain $L_1, L_2, \ldots, L_N$ is fully functional.

In the example of FIG. 1 the resistive voltage divider comprises the same number of resistors as LEDs that are present in the illumination device. However, there is no need for a certain number of resistors provided that the desired division ratio $k_{nominal}$ can be provided by the voltage divider. This result can also be achieved by a resistive voltage divider comprising a (digital or analog) potentiometer.

As mentioned above, the window of the window comparator has to be relatively narrow because the forward voltage of a single LED is not very high (e.g., $V_{LED}\approx 3.2$ V). However, when designing the window to be too narrow, the voltage $V_{BC}$ may leave the "allowable" interval $[V_{SC}-\Delta V, V_{SC}+\Delta V]$ due to temperature drift effects thus erroneously signalling an error. A minimum width of the window is required due to this effect.

Furthermore, it should be considered that the forward voltage of each individual LED may vary due to unavoidable tolerances (uncertainty) in the production process. Therefore, the forward voltage $V_{LED}$ of each LED actually includes a standard error $\Delta V_{LED}$ (corresponding to the variance $\Delta V_{LED}^2$). Considering the propagation of statistical errors the resulting standard error $\Delta V_{AC}$ of the voltage drop $V_{AC}$ across a LED chain including a number of N LEDs is $$\Delta V_{AC}=\sqrt{N}\cdot\Delta V_{LED}, \text{ and}$$

$$V_{AC}=N\cdot V_{LED}\pm\sqrt{N}\cdot\Delta V_{LED}.$$

Consequently, the voltage $V_{BC}$ at the middle tap B of the LED chain is (assuming that the number of LEDs arranged between terminal C and the middle tap is N/2):

$$V_{BC}=(N/2)\cdot V_{LED}\pm\sqrt{N/2}\cdot\Delta V_{LED},$$

whereas the voltage $V_{SC}$ at the output terminal S of the voltage divider equals $V_{AC}/2$, that is:

$$V_{SC}=(N/2)\cdot V_{LED}\pm(1/2)\cdot\sqrt{N}\cdot\Delta V_{LED}.$$

Similar considerations as the above can be made for the voltage difference $V_{BS}=V_{BC}-V_{SC}$, which is supplied to the window comparator. $V_{BS}$ can be calculated as follows:

$$V_{BS}=V_{BC}-V_{SC}=0\pm(1/2)\cdot\sqrt{N}\cdot\Delta V_{LED}.$$

The window comparator implements the inequality $|V_{BS}|<V_{TH}$ (the threshold $V_{TH}$ being half the window width). It can be concluded that $$V_{TH}>|\sqrt{N}\cdot\Delta V_{LED}/2|. \tag{1}$$

Otherwise a failure could erroneously detected due to the tolerances of the forward voltage $V_{LED}$.

When a LED is shorted between the terminal A and the middle tap B, then (substituting N by N−1 in $V_{SC}$) the voltage difference $V_{BS}=V_{BC}-V_{SC}$ is:

$$V_{BS}=V_{BC}-V_{SC}=V_{LED}/2\pm(1/2)\cdot\sqrt{N-1}\cdot\Delta V_{LED}.$$

In order to detect the failure correctly, the inequality implemented by the window comparator has to fulfill $$V_{TH}<V_{LED}/2-\sqrt{N-1}\cdot\Delta V_{LED}/2. \tag{2}$$

For a proper detection of a short-circuited LED the comparator has to meet the inequalities (1) and (2) as denoted above. These inequalities are valid as long as $N<N_{MAX}$, whereby the comparison of the right hand sides of (1) and (2) yields $$V_{LED}=\{\sqrt{N_{MAX}}+\sqrt{N_{MAX}-1}\}\cdot\Delta V_{LED}\approx 2\cdot\sqrt{N_{MAX}}\cdot\Delta V_{LED}, \text{ and}$$

$$N_{MAX}=(1/4)\cdot(V_{LED}/\Delta V_{LED})^2.$$

For a forward voltage $V_{LED}=3.2$ V and a standard deviation of $\Delta V_{LED}=0.5$V (e.g., in accordance with the specification of the OSRAM Golden DRAGON Plus LED) it can be concluded that the number of LEDs in the chain has to be equal to or smaller than smaller than $N_{MAX}=10$.

The above considerations show that the circuit of FIG. 1 for detecting short-circuited LEDs will not operate properly for LED chains with a large number of LEDs. Thus there remains a need for a circuit for detecting failures in an illumination device comprising a plurality (e.g. more than ten) of light emitting diodes.

Figure 2:
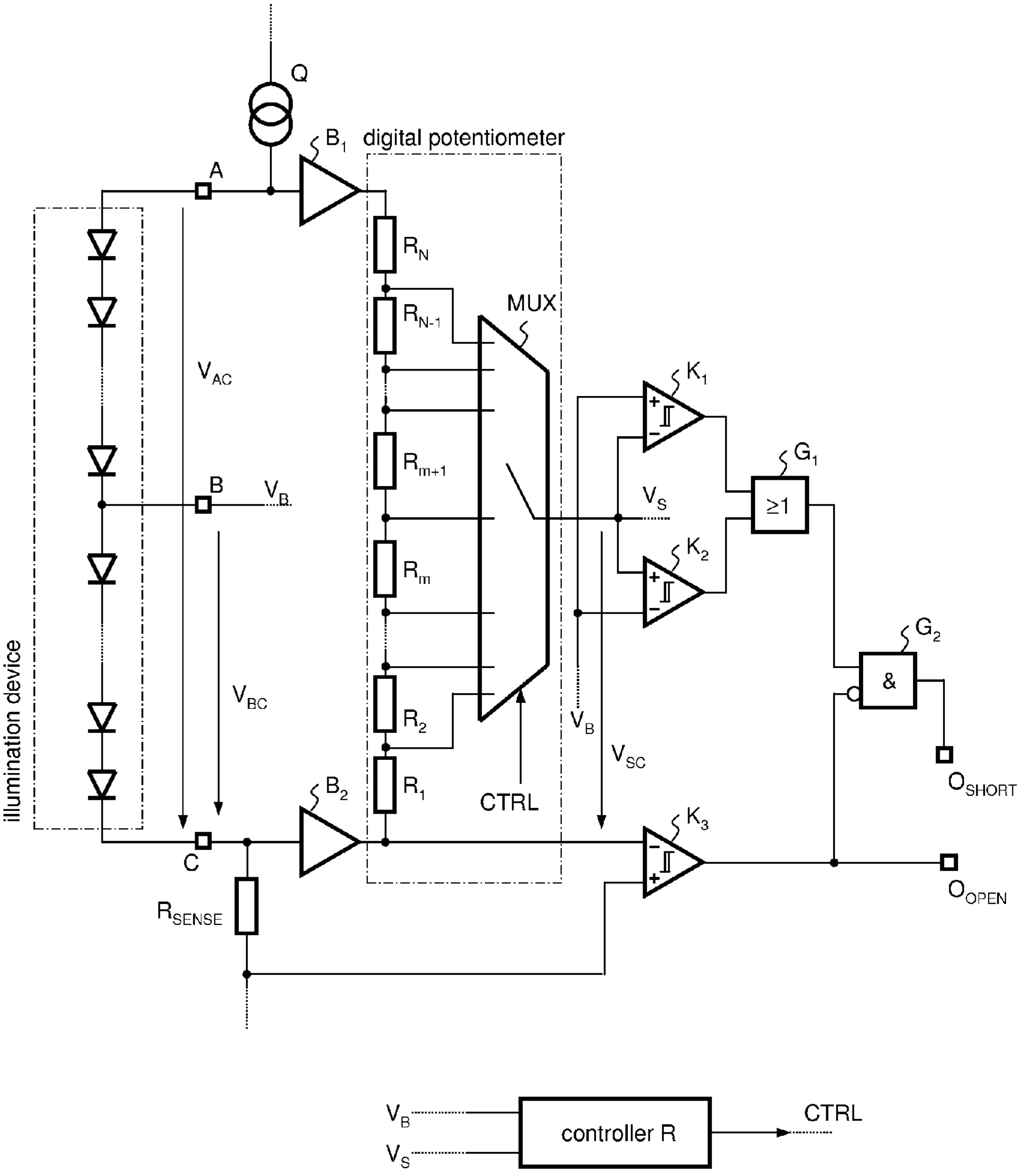
FIG. 2 illustrates a second example of the invention comprising a voltage divider having a plurality of middle taps and a multiplexer for selecting an appropriate middle tap for providing the nominal value.

In the example embodiment of FIG. 2, the resistive voltage divider of FIG. 1, which provides a fixed division ratio of m/N, is replaced by a digital potentiometer comprising a series of resistors $R_1$, $R_2$, . . . , $R_K$ (for example K=256) of equal resistance whereby the circuit nodes between two neighboring resistors are tapped by a multiplexer MUX. That is, the multiplexer MUX connects, dependent on a (for example, 8-bit) control signal CTRL—to a selectable circuit node between two neighboring resistors thus setting the nominal division ratio $k_{nominal}$. In case of an 8-bit digital potentiometer the ratio can be set in steps of 1/255 (approximately 0.39 percent) of the aggregate value.

The use of a digital potentiometer allows for setting the nominal ratio $k_{nominal}$ to a such a value that that the initial difference between the potential $V_B$ (or the voltage $V_{BC}$) at the middle tap of the LED chain and the potential $V_S$ (or the voltage $V_{SC}$) at the output of the multiplexer MUX are approximately equal. In other words, the voltage difference $V_{BS}$ supplied to the comparator is zeroized thus compensating for the effect of production tolerances (production spread). This can be done at the end of the production line by measuring the difference voltage $V_{BS}$ for a faultless LED chain and a initial multiplexer setting $k_{nominal}$=m/N, determining an appropriate control signal CTRL to be applied to the multiplexer MUX such that the difference voltage $V_{BS}$ becomes zero, and storing (e.g. in a non-volatile memory) that setting, so that it can be used during later operation. Dependent on the actual forward voltages of the individual LEDs in the chain the actual division ratio $k_{nominal}$ used during operation differs from the initial value m/N due to the zeroizing mentioned above. Instead or additionally to the zeroizing at the end of the production line, the voltage difference may be sensed at every startup of the circuit. The window comparator has to detect a voltage change of $\pm 0.5\cdot(V_{LED}-\Delta V_{LED})$, i.e. the thresholds of the comparator are $\pm 0.5\cdot(V_{LED}-\Delta V_{LED})-V_{LSB}$, wherein $V_{LSB}$ is the voltage corresponding to the least significant bit (i.e. $V_{AC}/256$).

It should be noted that the digital potentiometer together with the buffers $B_1$ and $B_2$ can be seen as digital-to-analogue converter (DAC) receiving a reference voltage $V_{AC}$ and providing an analogue output voltage $V_{SC}$ in accordance with a digital input signal CTRL. Of course any type of DAC may be used instead of the digital potentiometer. A fully digital implementation will be discussed later with respect to FIG. 3.

In order to be able to detect not only short circuit defects but also open circuit defects, both examples of FIG. 1 and FIG. 2 may provide a circuit for detecting whether the load current flowing through the illumination device exceeds a given nominal value or not. In the illustrated examples a current measurement signal $V_C$ is provided by a shunt resistor connected in series to the illumination device (or alternatively might be included in the illumination device). However, other current measurement means can be employed. In case the load current of the illumination device is switched by a MOSFET, a sense-FET arrangement may be used for providing a signal representing the load current. In some applications a signal representing the load current may be tapped directly in the current source circuit that supplies the load current to the illumination device (see current source Q in FIGS. 1 and 2).

In the example of FIG. 2 the current measurement signal is compared to a threshold value using a comparator $K_3$, whereby the threshold value is determined by the hysteresis of the comparator $K_3$. The output $O_{OPEN}$ of comparator $K_3$ indicates (by showing a logic level "high") whether the current measurement signal $V_C$ is below the threshold which means that no load current flows through the illumination device due to an open circuit defect of a LED.

Figure 3:
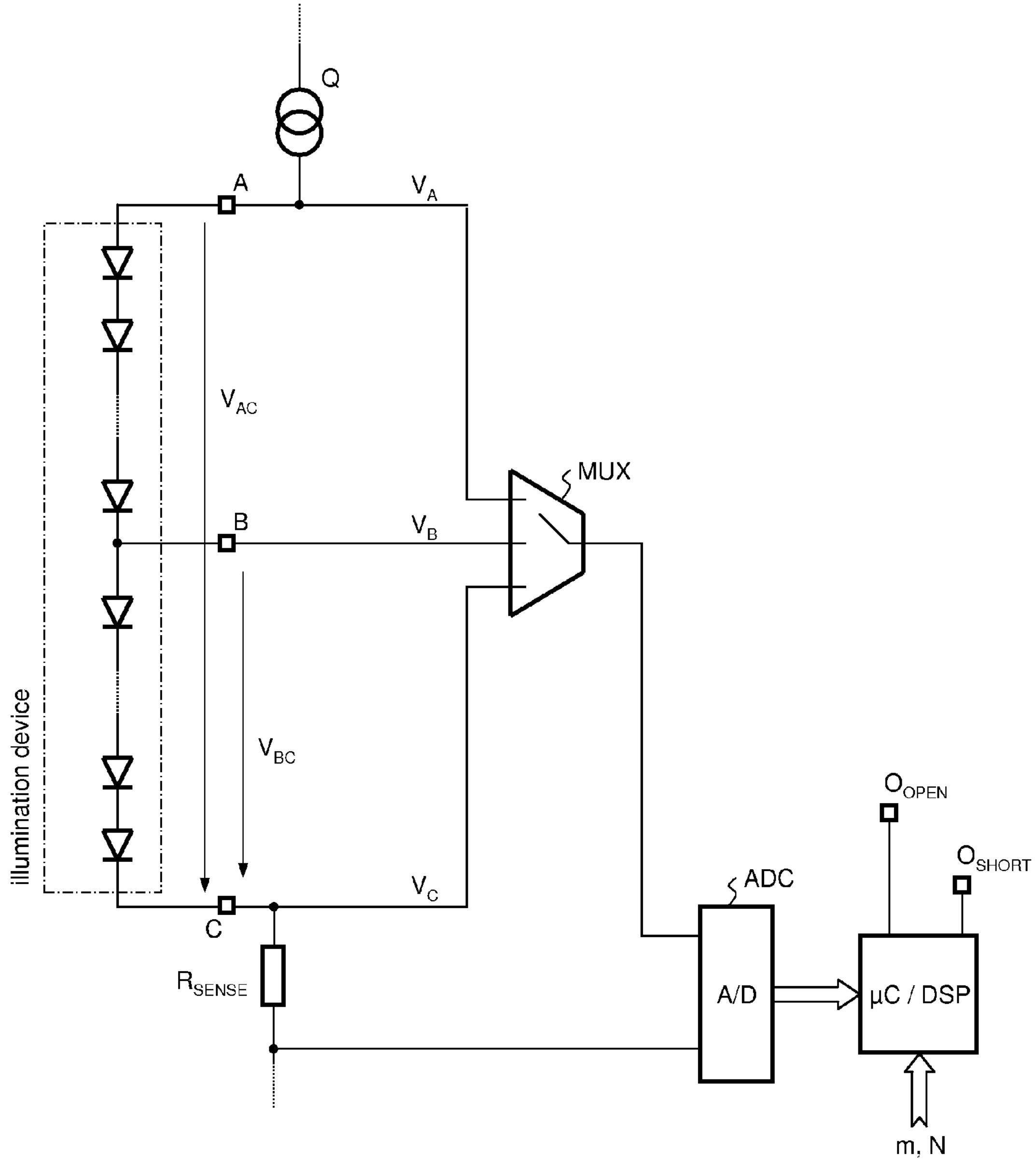
FIG. 3 illustrates a third example of the invention comprising analog-to-digital conversion means and an arithmetic logic unit for assessing the illumination device.

In order to inhibit an erroneous detection of a short circuit the output of the window comparator (comprising $K_1$, $K_2$, and $G_1$) may be combined with the output signaling an open circuit by means of a further gate $G_2$ such that the output of the window comparator is only gated to an output terminal $O_{SHORT}$ if comparator $K_3$ does not signal an open circuit. In the illustrated examples the gate $G_2$ is an AND gate with one inverted input. However, it is clear to a person of ordinary skill that other types of gates can be used for implementing the same functionality. Additionally different logic ("high" or "low") levels can be used for signaling defective LEDs. A further example of the present invention is illustrated in FIG. 3, which illustrates a fully digital implementation of the detection of faulty LEDs. This example makes use of at least one analog-to-digital converter ADC and an arithmetic logic unit ALU (which might be included in a micro controller or a digitals signal processor). In the example of FIG. 3 the function provided by the window comparator ($K_1$, $K_2$, $G_1$) is digitally implemented in the arithmetic logic unit ALU. Therefore the electric potentials $V_A$, $V_B$, and $V_C$ present at the circuit nodes A, B, and C, respectively, are digitized either parallel using three analog-to-digital converters or sequentially by using a multiplexer MUX' that sequentially connects one analog-to-digital converter ADC to circuit node A, B, and C, respectively. The multiplexer MUX' and the analog-to-digital converter ADC may also be controlled by the arithmetic logic unit ALU. The arithmetic logic unit ALU receives digital representations of the electric potentials $V_A$, $V_B$, and $V_C$ and is programmed to calculate the voltage drop $V_{AC}$ across the LED chain, namely $$V_{AC}=V_A-V_C,$$

and the tapped fractional voltage $$V_{BC}=V_B-V_C.$$

Having calculated the values of the voltages $V_{AC}$ and $V_{BC}$, the actual value $V_{BC}$ can be compared to the nominal value $k_{nominal}\cdot V_{AC}$ as already explained above with reference to the example of FIG. 2, wherein the ratio $k_{nominal}$ is initially set to $V_{BC}/V_{AC}$ so that, for a faultless LED chain, the actual values of $V_{BC}$ and $V_{SC}=k_{nominal}\cdot V_{AC}$ are equal and the difference $V_{BS}=V_{BC}-V_{SC}$ is zero.

Before the zeroizing the factor $k_{nominal}$ can be initially set to $k_{nominal}$=m/N, whereby N is the total number of LEDs in the LED chain and m is the number of LEDs connected between the circuit nodes B and C, and subsequently be "tuned" as already explained above with respect to FIG. 2.

Furthermore, the digital representation of the potential $V_C$ can be used as current measurement signal analogous to the example of FIG. 2. Consequently, the digital representation of the potential $V_C$ can be used for testing whether an open circuit defect is present in one of the LEDs which is the case when $V_C$ does not exceed a given threshold value $V_{TH}$.

An exemplary algorithm performed by the arithmetic logic unit ALU is as follows (provided that $k_{nominal}$ has been set such that $V_{BC}=k_{nominal}\cdot V_{AC}$ for a faultless LED chain):

```
if V_C > V_TH
then
    calculate V_AC and V_BC;
    calculate V_SC = k_nominal·V_AC;
    if V_BC < (V_SC − ΔV) or V_BC > (V_SC + ΔV)
    then signal short circuit;
else
signal open circuit.
```

A person of ordinary skill will see that the above algorithm can be modified in various ways without substantially changing its effective function. Depending on the hardware (e.g., the arithmetic logic unit ALU) that is actually used, the optimal implementation of the above will vary due to the specific requirements of the hardware. For example an alternative implementation may be as follows:

```
if V_C > V_TH
then
    calculate V_AC and V_BC;
    calculate k = V_BC/V_AC;
    if k < (k_nominal − Δk) or k > (k_nominal + Δk)
    then signal short circuit;
else
signal open circuit.
```

The failure detection circuits as described hereinabove can be combined with a driver circuit configured to supply the illumination device with a desired load current. A current source Q shown in FIGS. 2 and 3 can be regarded as part of a driver circuit. To decouple the failure detection circuit from the illumination device buffers $B_1$ and $B_2$ (impedance converters) having a high input impedance may be employed to avoid bypassing of a part of the load current via the voltage dividers of FIG. 2. However, if the total resistance of the voltage is high enough, the buffers may be omitted and substituted by a direct connection between the voltage dividers and the illumination device. Buffers may also be connected upstream to the analog-to-digital-converter ADC in the example of FIG. 3 if the input impedance of the analog-to-digital-converter ADC is not high enough.

After a short-circuited LED has been detected, the ratio $k_{nominal}$ may be re-initialized so that the difference voltage $V_{BS}$ becomes zero again in order to be able to detect when a second LED fails as a short-circuit. At the same time a counter value may be counted up so as to count the number of faulty (short-circuited) LEDs in the LED chain. Counting the number of faulty LEDs allows for determining when the illumination device including the LED chain has to be replaced as too many LEDs failed and the overall luminous intensity became too small.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

What is claimed is:

1. An apparatus for detecting failures in an illumination device comprising a plurality of light emitting diodes connected in series, the device comprising:

a first circuit node, a second circuit node, and a third circuit node for interfacing the illumination device such that a voltage supplying the plurality of light emitting diodes is applied between the first and the second circuit node and a first fraction of a supply voltage drop is provided between the third and the second circuit node; and an evaluation unit coupled to the first circuit node, the second circuit node, and the third circuit node and configured to assess whether a voltage present at the third circuit node is within a pre-defined range of tolerance about a nominal value that is defined as a second fraction of the supply voltage present between the first and the second circuit node, voltage adjustment circuitry configured to preset the second fraction such that the nominal value substantially equals the voltage present at the third circuit node when the illumination device includes only faultless light emitting diodes.

2. The apparatus of claim 1, wherein the evaluation unit comprises a measurement circuit configured to provide a signal representing a load current flowing through the illumination device.

3. The apparatus of claim 2, wherein the evaluation unit comprises a comparator configured to provide a first output signal indicating whether the illumination device comprises an open circuit.

4. The apparatus of claim 1, wherein the evaluation unit comprises a voltage divider coupled to the first and the second circuit node, the voltage divider configured to provide at a middle tap a programmable fraction of a potential difference present between the first and the second circuit node, wherein the fraction is programmed such that the voltage at the middle tap equals the voltage present at the third circuit node when the illumination device includes only faultless light emitting diodes.

5. The apparatus of claim 4, wherein the evaluation unit comprises a window comparator receiving as input signals an electric potential present at the third circuit node and the second fraction of the potential difference present between the first and the second circuit node.

6. The apparatus of claim 5, wherein the evaluation unit further comprises:

a measurement circuit configured to provide a signal representing a load current flowing through the illumination device; and a comparator configured to provide, dependent on the signal representing the load current, a first output signal indicating whether the illumination device comprises an open circuit.

7. The apparatus of claim 6, wherein the evaluation unit further comprises a logic circuit that is configured to provide a second output signal indicating whether the illumination device comprises a short circuit, the second output signal representing the output of the window comparator in case the first output signal does not indicate an open circuit.

8. The apparatus of claim 1, wherein the evaluation unit comprises a voltage divider coupled to the first circuit node and the second circuit node, the voltage divider comprising:

a plurality of middle taps; and a multiplexer configured to select one of the middle taps in accordance with a control signal for connecting it to an output of the multiplexer, an electric potential thus provided at the output of the multiplexer forming the second fraction of a supply voltage present between the first and the second circuit node, wherein the control signal is preset such that the voltage at the multiplexer output is substantially equal to the voltage at the third circuit node when the illumination device includes only faultless light emitting diodes.

9. The apparatus of claim 1, wherein the evaluation unit comprises an analog-to-digital conversion circuit coupled to the first circuit node, the second circuit node, and the third circuit node and configured to provide digital representations of electric potentials present at the first circuit node, the second circuit node and the third circuit node, respectively.

10. The apparatus of claim 9, wherein the analog-to-digital conversion circuit comprises a multiplexer and an analog-to-digital converter coupled such that the multiplexer subsequently supplies the electric potentials present at the first circuit node, the second circuit node and the third circuit node, respectively, to the analog-to-digital converter.

11. The apparatus of claim 9, wherein the evaluation unit further comprises an arithmetic logic unit (ALU) connected to the analog-to-digital conversion circuit, the ALU configured to decide whether the digital representation of an electric potential present at the third circuit node is greater than the preset second fraction plus an allowable tolerance value or smaller than the preset second fraction minus the allowable tolerance value.

12. The apparatus of claim 11, wherein the arithmetic logic unit is further configured to compare one of the digital representations received from the analog-to-digital conversion circuit with a threshold, a result of the comparison indicating whether the illumination device comprises an open circuit.

13. The apparatus of claim 11, wherein the ALU is further configured to indicate a short circuit present in the illumination device when no open circuit is detected and the digital representation of the electric potential present at the third circuit node deviates by more than the allowable tolerance value from the preset second fraction.

14. The apparatus of claim 1, further comprising the plurality of light emitting diodes.

15. The apparatus of claim 1, wherein the circuitry configured to preset the second fraction comprises a controller.

16. The apparatus of claim 15, wherein the controller is configured to substantially zeroize a difference between the nominal value and the second fraction.

17. A method for detecting failures in an illumination device comprising a series circuit of a plurality of light emitting diodes, the method comprising:

sensing a voltage supplying the plurality of light emitting diodes;

sensing a first fraction of the supply voltage at a middle tap of the series circuit of light emitting diodes;

assessing whether the sensed first fraction is within a predefined range of tolerance about a nominal value that is defined as a second fraction of a sensed voltage drop; and during a time when the illumination device includes only faultless light emitting diodes, presetting the second fraction using a voltage adjustment circuit such that the nominal value substantially equals a voltage present at the middle tap of the series circuit of light emitting diodes.

18. The method of claim 17, wherein the preset second fraction of the sensed voltage drop is tapped at a middle tap of a programmable voltage divider receiving the same voltage drop as at least two light emitting diodes.

19. The method of claim 17, wherein, after a short-circuited LED has been detected, the method further comprises updating the preset second fraction such that the nominal value again equals the first fraction of the supply voltage at the middle tap of the of the series circuit of light emitting diodes.

20. The method of claim 19, further comprising counting a number of faulty LEDs.

21. A circuit for detecting failures in an illumination device comprising a plurality of light emitting diodes connected in series, the device comprising:

a voltage divider coupled to a first terminal and to a second terminal, the voltage divider comprising a plurality of middle taps and a multiplexer configured to select one of the middle taps in accordance with a control signal for connecting it to an output of the multiplexer, wherein the first terminal and the second terminal are configured to be coupled to the illumination device and a voltage supplying the plurality of light emitting diodes is configured to be applied between the first terminal and the second terminal; and a controller coupled to the output of the multiplexer and an intermediate terminal and configured to supply the control signal, wherein the control signal is preset such that the voltage at the output of the multiplexer is substantially equal to the voltage at the intermediate terminal when the illumination device includes only faultless light emitting diodes, and wherein the intermediate terminal is configured to be coupled to the illumination device and is configured such that a fraction of a supply voltage drop is present between the intermediate terminal and the second terminal.

22. The circuit of claim 21, further comprising a first comparison circuit coupled to the output of the multiplexer and the intermediate terminal, wherein the comparison circuit is configured to generate at an output a short circuit fault signal corresponding to a short circuit fault in the plurality of light emitting diodes.

23. The circuit of claim 21, further comprising a second comparison circuit coupled to the second terminal and configured to generate at an output an open circuit fault signal corresponding to an open circuit fault in the plurality of light emitting diodes, wherein the second comparison circuit comprises:

a sense resistor coupled between the second terminal and a reference node, and a comparator configured to supply the output of the second comparison circuit and having a first input coupled to the second terminal and a second input coupled to the reference node.

* * * * *